United States Patent [19]

Lange, Sr. et al.

[11] Patent Number: 5,354,951
[45] Date of Patent: Oct. 11, 1994

[54] CIRCUIT BOARD COMPONENT SHIELDING ENCLOSURE AND ASSEMBLY

[75] Inventors: William A. Lange, Sr., Palm Harbor; Lester R. Fisher, Jr., New Port Richey; William A. Lange, II, Palm Harbor, all of Fla.

[73] Assignee: Leader Tech, Inc., Tampa, Fla.

[21] Appl. No.: 31,659

[22] Filed: Mar. 15, 1993

[51] Int. Cl.⁵ .............................. H05K 9/00
[52] U.S. Cl. .................... 174/35 R; 361/818
[58] Field of Search .......... 174/35 R, 35 MS, 35 GC, 174/50, 65 R, 66, 67; 220/3.8, 4.02, 4.28, 4.31, 623, 686, 687–691; 361/399, 400, 424; 211/41; 334/85; 455/347, 348

[56] References Cited

U.S. PATENT DOCUMENTS

| | | |
|---|---|---|
| 3,721,746 | 3/1973 | Knappenberger ............. 174/35 MS |
| 3,806,767 | 4/1974 | Lehrfeld ........................ 361/424 X |
| 4,370,515 | 1/1983 | Donaldson ..................... 174/35 R |
| 4,404,617 | 9/1983 | Ohyama et al. ..................... 361/424 |
| 4,754,101 | 6/1988 | Stickney et al. ................. 174/35 R |
| 4,841,414 | 6/1989 | Hibino et al. ........................ 361/424 |
| 4,890,199 | 12/1989 | Beutler .......................... 174/35 R X |
| 5,014,160 | 5/1991 | McCoy, Jr. .................... 174/35 R X |
| 5,029,254 | 7/1991 | Stickney ........................ 174/35 GC |
| 5,043,848 | 8/1991 | Rogers et al. ....................... 361/424 |
| 5,095,177 | 3/1992 | Johnson ........................ 174/35 R |
| 5,160,807 | 11/1992 | Fry et al. ........................ 174/35 R |
| 5,175,395 | 12/1992 | Moore ............................. 174/35 R |
| 5,184,283 | 2/1993 | Hamel .............................. 361/394 X |

FOREIGN PATENT DOCUMENTS

3736833  5/1989  Fed. Rep. of Germany .
131548   6/1988  Japan .
62595    3/1991  Japan .

Primary Examiner—Leo P. Picard
Assistant Examiner—Christopher Horgan
Attorney, Agent, or Firm—John R. Flanagan

[57] ABSTRACT

An EMI shielding assembly includes an elongated enclosure made of an electrically conductive material and having a plurality of interconnected walls arranged in a polygonal configuration to surround an electronic component on a circuit board, a plurality of mounting pins attached to lower portions of the walls and extending downwardly from a lower edge thereon for attachment to the circuit board, and plurality of inner and outer tabs formed in upper portions of the walls which extend upwardly from the lower portions thereof. The inner and outer tabs are disposed in spaced apart, alternating and offset relationship with respect to one another along the upper portions of the walls so as to create an annular channel therebetween which extends around the enclosure along the upper portions of the interconnected walls thereof. The shielding assembly also includes a cover made of an electrically conductive material and having side portions removably inserted into the annular channel defined by the inner and outer tabs and into a frictional fitting relation therebetween to thereby removably mount the cover over the enclosure so as to provide an EMI shield for the electronic component therein.

22 Claims, 1 Drawing Sheet

U.S. Patent           Oct. 11, 1994           5,354,951
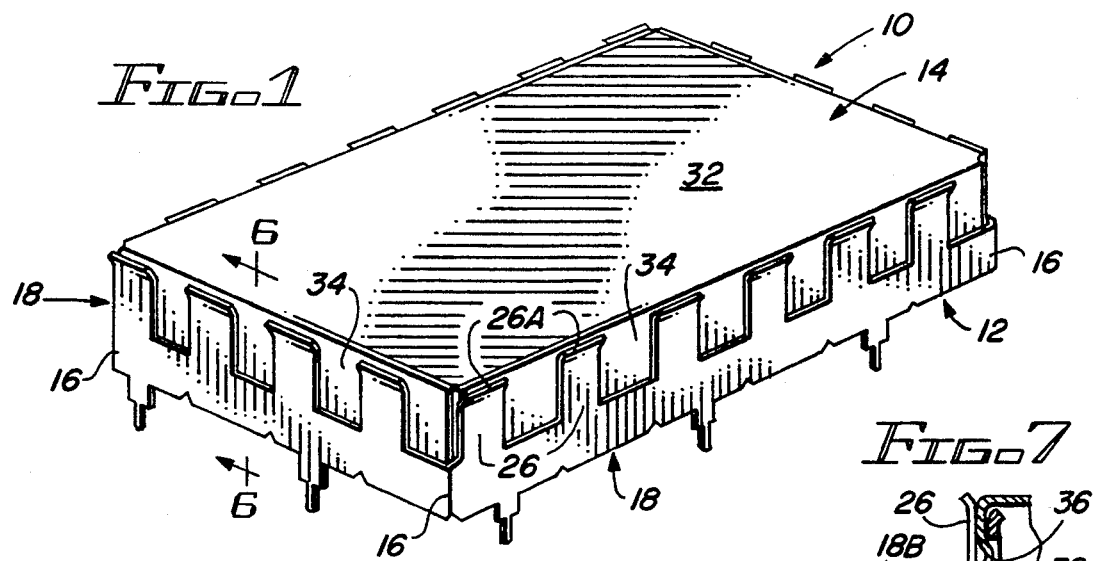
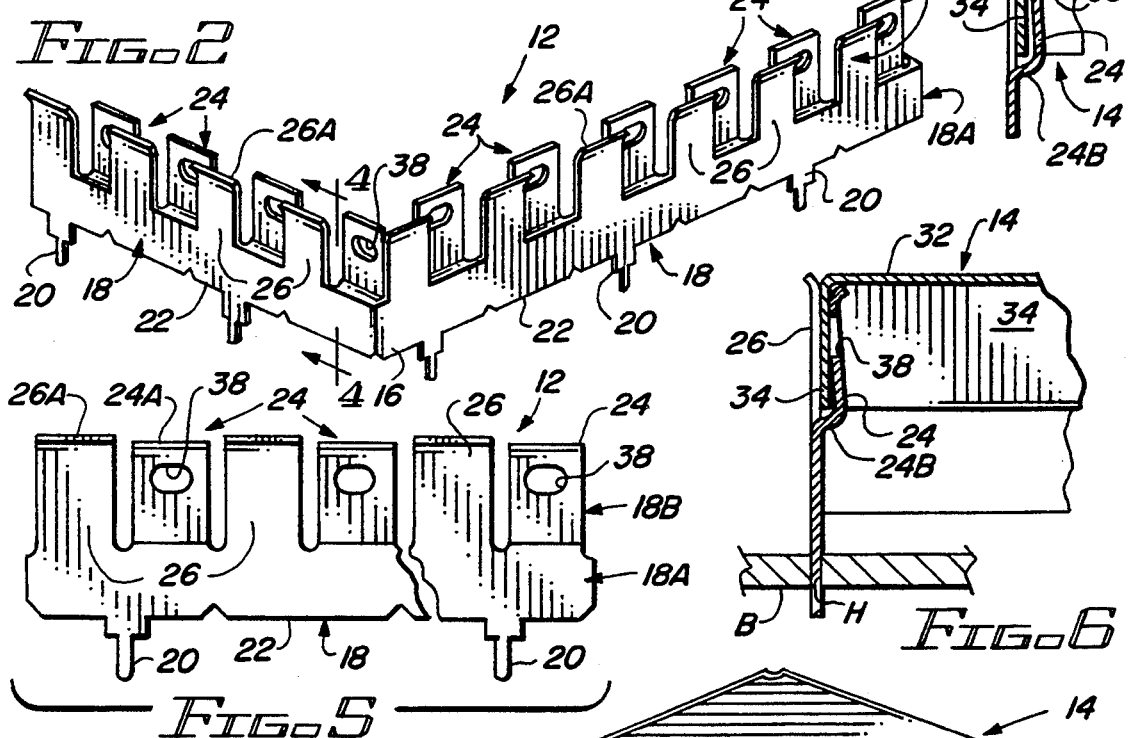
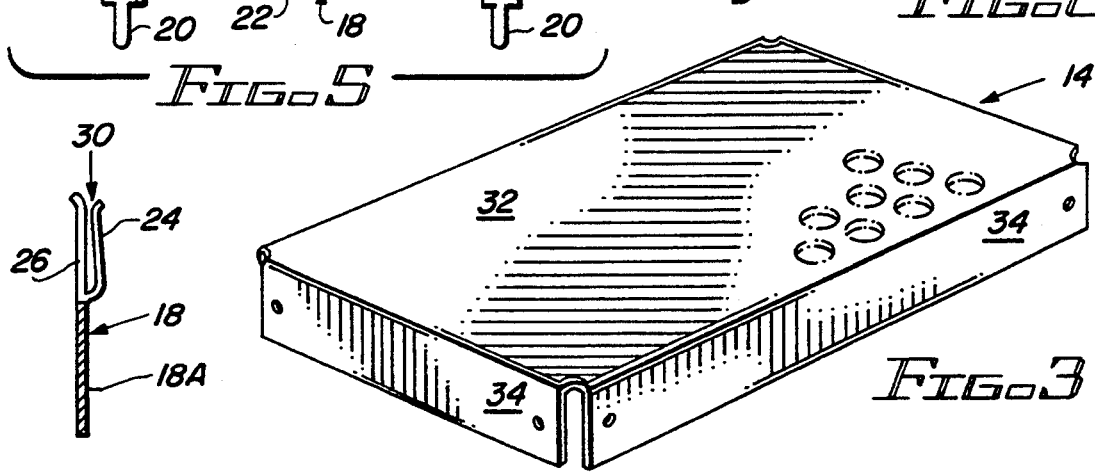

CIRCUIT BOARD COMPONENT SHIELDING ENCLOSURE AND ASSEMBLY

BACKGROUND OF THE INVENTION

1. Field of the Invention

The present invention generally relates to shielding devices for minimizing electromagnetic interference and, more particularly, is concerned with an enclosure and an assembly employing the enclosure for providing effective shielding of circuit board compoents against electromagnetic interference.

2. Description of the Prior Art

Electronic components found in various types of transmitters, receivers, computers and other electronic devices emit or are susceptible to electromagnetic radiation. It is therefore desirable to shield circuit components to reduce undesirable electromagnetic interference (EMI) and/or susceptibility effects with the use of conductive shields that reflect or dissipate electromagnetic charges and fields. Such shields are generally grounded to allow electrical charges and fields to be dissipated without disrupting the operation of the electronic components enclosed within the shield.

Various types of shielding devices for electronic components mounted on printed circuit boards have been proposed in the prior patent art. Representative examples of such shielding devices are the ones disclosed in U.S. patents to Stickney et al (U.S. Pat. No. 4,754,101), Hibino et al (U.S. Pat. No. 4,841,414), McCoy, Jr. (U.S. Pat. No. 5,014,160), Rogers et al (U.S. Pat. No. 5,043,848), Johnson (U.S. Pat. No. 5,095,177), Fry et al (U.S. Pat. No. 5,160,807) and Moore (U.S. Pat. No. 5,175,395); a Japanese patent to Tsunoda (U.S. Pat. No. 62,595), and a German patent to Bardon (U.S. Pat. No. 3,736,833). These shielding devices frequently include a base frame which is mounted to the printed circuit board surrounding the circuit board components, and a cover which fits over and connects with the base frame enclosing the printed circuit board components.

Various difficulties may be encountered with respect to providing a satisfactory connection of the cover to the base frame. The connection must secure the cover to the base frame in a reliable manner which prevents dislodgement due to shock and vibration. At the same time, the connection must permit easy removal of the cover for periodic visual inspection of the printed circuit board and the components enclosed by the shield.

As an example, such difficulties may be experienced with respect to the electromagnetic shielding assembly of U.S. Pat. No. 4,754,101 to Stickney et al. The shielding assembly of this patent has a cover plate and a base frame with a plurality of walls made from a length or strip of metallic material. The base frame is formed in a rectangular configuration so as to surround the electronic component on the circuit board. The base frame has a plurality of spaced mounting pins projecting downwardly from a lower edge of the strip for alignment within holes in the circuit board. The base frame also has a plurality of spaced deflectable engagement prongs defined by spaced slots and extending upwardly from an upper edge of the strip. The prongs have flanged upper end to allow insertion of the cover plate within the base frame and outwardly formed recesses between the flanged upper ends to receive and hold the cover plate. The above-described design of the shielding assembly of the Stickney et al patent fails to provide any positive means for preventing inadvertent overinsertion of the cover plate downwardly past the recesses of the prongs which can result in overdeflection thereof and damage thereto and to the electronic component enclosed by the shielding assembly.

Consequently, a need still exists for improvement in the design of shielding devices for printed circuit board components.

SUMMARY OF THE INVENTION

The present invention provides a circuit board component shielding enclosure and assembly designed to satisfy the aforementioned need. The shielding assembly of the present invention employs an enclosure of the present invention and a cover frictionally interfitted therewith which together provide effective EMI shielding of components while allowing the cover to be easily fitted to and removed from the enclosure. The shield assembly has features providing a secure attachment with and a positive downward stop of the cover relative to the enclosure while allowing easy removal of the cover for component accessibility.

Accordingly, the present invention is directed to a circuit board component shielding enclosure which comprises: (a) a plurality of interconnected walls arranged in a polygonal configuration to surround an electronic component on a circuit board, each of the walls having a lower portion and an upper portion extending upwardly from the lower portion; (b) a plurality of mounting pins attached to the lower portions of the respective walls and extending downwardly from lower edges thereof for attachment to the circuit board; and (c) a plurality of inner and outer tabs formed in the upper portions of the respective walls, the inner and outer tabs being disposed in spaced, alternating and offset relationship with respect to one another along the upper portions of the walls so as to create an annular channel between the inner and outer tabs extending along the upper portions of the respective interconnected walls.

Also, the present invention is directed to a circuit board component shielding assembly which comprises: (a) the above-defined enclosure; and (b) a cover having a top portion and a plurality of side portions attached to and extending downwardly from the top portion and arranged in a polygonal configuration matching that of the interconnected walls of the enclosure. The side portions of the cover are removably inserted into the annular channel defined by the inner and outer tabs and into a frictional fitting relation therewith to thereby removably mount the cover over the enclosure and provide an electromagnetic interference shield for the electronic component.

These and other features and advantages of the present invention will become apparent to those skilled in the art upon a reading of the following detailed description when taken in conjunction with the drawings wherein there is shown and described an illustrative embodiment of the invention.

BRIEF DESCRIPTION OF THE DRAWINGS

In the following detailed description, reference will be made to the attached drawings in which:

FIG. 1 is a perspective view of a circuit board component shielding assembly of the present invention.

FIG. 2 is a fragmentary perspective view of an enclosure of the shielding assembly of FIG. 1.

FIG. 3 is a perspective view of a cover of the shielding assembly of FIG. 1.

FIG. 4 is an enlarged sectional view of the enclosure taken along line 4—4 of FIG. 2.

FIG. 5 is an enlarged fragmentary elevational view of the enclosure of FIG. 2.

FIG. 6 is an enlarged fragmentary sectional view of the enclosure and cover taken along line 6—6 of FIG. 1.

FIG. 7 is a view similar to that of FIG. 6, except showing a dimple formed on a side portion of the cover being interengaged with a hole in one of the inner tabs of the enclosure.

DETAILED DESCRIPTION OF THE INVENTION

Referring to the drawings and particularly to FIGS. 1 to 3, there is illustrated a circuit board component electromagnetic shielding assembly, generally designated 10, of the present invention. Basically, the shielding assembly 10 includes an elongated fence or enclosure 12 of the present invention and a cover 14 fitted over the enclosure 12. The enclosure 12 and cover 14 are preferably made of a suitable electrically conductive material, such as a conductive metal.

Referring to FIGS. 1 and 2, the enclosure 12 of the shielding assembly 10 is defined by an elongated generally planar strip of material bent at spaced apart locations to define corners 16 of the enclosure 12 and a plurality of generally planar walls 18 extending between and interconnected by the corners 16. The walls 18 are thus arranged in a polygonal, preferably rectangular, configuration adapting the enclosure 12 to surround an electronic component (not shown) mounted on a circuit board B (see FIG. 6).

Referring to FIGS. 1, 2, 5 and 6, the enclosure 12 of the shielding assembly 10 also includes a plurality of mounting pins 20 attached to lower portions 18A of the walls 18 and extending downwardly from lower edges 22 thereon. The mounting pins 20 are preferably integrally formed with and in the plane of the respective walls 18. The mounting pins 20 are provided to facilitate attaching of the enclosure 12 to the circuit board B by inserting the mounting pins 20 into selected ones of a plurality of holes H (only one being shown in FIG. 6) through the circuit board B and then by soldering the mounting pins 20 to electrically conductive receptacles (not shown) provided on the circuit board B.

Referring to FIGS. 2, 4, 5 and 6, the enclosure 12 of the shielding assembly 10 also includes a plurality of inner and outer tabs 24, 26. The inner and outer tabs 24, 26 are formed in respective upper portions 18B of the walls 18 which extend upwardly from the respective lower portions 18A thereof to upper edges 28 of the walls 18. The inner and outer tabs 24, 26 are disposed in spaced apart, alternating and offset relationship with respect to one another along the upper portions 18B of the walls 18 so as to create a continuous annular channel 30 therebetween which extends around the enclosure 12 along the upper portions 18B of the interconnected walls 18 thereof and is open from above to receive the cover 14.

More particularly, the outer tabs 26 in the upper portion 18B of each wall 18 are integrally connected to the lower portion 18B of the wall 18 and, in effect, constitute continuations or extensions of the lower portion 18A of wall 18 which extend substantially in the plane of the lower portion 18A of the wall 18. Only portions of the upper edge 18B of each wall 18 which constitute the upper ends 26A of the outer tabs 26 are flared outwardly beyond the plane of the wall 18 so as to make it relatively easy to insert the cover 14 downwardly into the annular channel 30 defined between the inner and outer tabs 24, 26.

The inner tabs 24 in the upper portion 18B of each wall 18 are integrally connected to the lower portion 18A of the wall 18 and extend in an offset fashion inwardly and upwardly therefrom. As mentioned above, these offset inner tabs 24 are arranged in an alternating fashion with the outer tabs 26 of the upper portion 18B of the wall 18. The upper upper ends 24A of the inner tabs 24 are flared inwardly so as to make it relatively easy to insert the cover 14 downwardly into the annular channel 30 defined between the inner and outer tabs 24, 26. As stated above, outer tabs 26, which are remaining sections of the upper portion 18B of the wall 18 being merely continuations of the lower portion 18A of the wall 18, do not outwardly deflect to any significant degree when the cover 14 is inserted into and removed from the annular channel 30. Most of the deflection occurs in offset inner tabs 24. Thus, the offset inner tabs 24 are made by a conventional forming operation wherein portions of the upper portion 18B of the wall 18 are cutout between the inner and outer tabs 24, 26 and then the inner tabs 24 are bent about two spaced parallel locations thereon to place them in the offset relationship to the wall 18. The lower inwardly extending portions of the inner tabs 24 where they are integrally connected to the wall 18 provide positive downward stops 24B which prevent overinsertion of the cover 14 onto the enclosure 12.

Referring to FIGS. 1, 3 and 6, the cover 14 of the shielding assembly 10 has a top portion 32 and a plurality of side portions 34 integrally attached to and depending downwardly from the top portion 32. The side portions 34 of the cover 14 are arranged in a polygonal, preferably rectangular, configuration matching that of the interconnected walls 18 of the enclosure 14. However, the perimeter size of the cover 14 is matched with that of the annular channel 30 so as to permit the side portions 34 of the cover 14 to be removably inserted into the annular channel 30 defined between the inner and outer tabs 24, 26 and into a frictional fitting relation therebetween to thereby removably mount the cover 14 over the enclosure 12, as seen in FIG. 1, and provide an EMI shield for the electronic component (not shown) enclosed by the shielding assembly 10.

FIGS. 2, 3, 5 and 7 show an optional feature which can be employed in the shielding assembly 10 of the present invention. A plurality of dimples 36 can be formed on the side portions 34 of the cover 14 which will interengaged with selected ones of respective holes 36 defined through the inner tabs 24 of the enclosure 12. This feature provides a releasable snap-in lock connection in addition to the frictionally fitted connection which may be desirable in applications where the shielding assembly 10 will be subject to severe vibrations.

It is thought that the present invention and its advantages will be understood from the foregoing description and it will be apparent that various changes may be made thereto without departing from its spirit and scope of the invention or sacrificing all of its material advantages, the form hereinbefore described being merely preferred or exemplary embodiment thereof.

We claim:

1. An electromagnetic interference shielding enclosure, comprising:
   (a) a plurality of interconnected walls made of electically conductive material being arranged in a polygonal configuration to surround an electronic component on a circuit board, each of said walls having a lower portion and an upper portion extending upwardly from said lower portion;
   (b) a plurality of mounting pins made of an electrically conductive material and being attached to said lower portions of said respective walls and extending downwardly from lower edges thereon for attachment to the circuit board; and
   (c) a plurality of inner and outer tabs formed in said upper portions of said respective walls, said inner and outer tabs being disposed in spaced, alternating and offset relationship with respect to one another along said upper portions of said walls so as to create an annular channel between said inner and outer tabs extending along said upper portions of said respective interconnected walls, said annular channel being open from above so as to adapt said annular channel to receive a downward extending edge of a cover in said annular channel in engagement between said inner and outer tabs.

2. The enclosure of claim 1 wherein:
   each of said walls is planar in configuration; and
   each of said mounting pins is integrally formed with and extend in the plane of a respective one of said walls.

3. The enclosure of claim 1 wherein:
   each of said walls is planar in configuration; and
   said outer tabs in said upper portion of a respective one of said walls are integrally connected to said lower portion of said respective one wall so as to extend substantially in the plane of said lower portion of said wall.

4. The enclosure of claim 3 wherein said outer tabs have upper ends which are flared outwardly beyond the plane of said wall.

5. The enclosure of claim 1 wherein said inner tabs in said upper portion of a respective one of said walls are integrally connected to said lower portion of said wall and extend in an offset fashion inwardly and upwardly therefrom.

6. An electromagnetic interference shielding enclosure, comprising:
   (a) a plurality of interconnected walls made of electically conductive material being arranged in a polygonal configuration to surround an electronic component on a circuit board, each of said walls having a lower portion and an upper portion extending upwardly from said lower portion;
   (b) a plurality of mounting pins made of an electrically conductive material and being attached to said lower portions of said respective walls and extending downwardly from lower edges thereon for attachment to the circuit board; and
   (c) a plurality of inner and outer tabs formed in said upper portions of said respective walls, said inner and outer tabs being disposed in spaced, alternating and offset relationship with respect to one another along said upper portions of said walls so as to create an annular channel between said inner and outer tabs extending along said upper portions of said respective interconnected walls, said inner tabs in said upper portion of a respective one of said walls being integrally connected to said lower portion of said wall and extending in an offset fashion inwardly and upwardly therefrom.

7. The enclosure of claim 6 wherein said inner tabs have bends at least at two spaced parallel locations therein so as to align said inner tabs in the offset relationship to said wall.

8. The enclosure of claim 6 wherein said inner tabs have lower inwardly extending portions which define positive downward stops.

9. The enclosure of claim 6 wherein at least selected one of said inner tabs have holes defined therethrough.

10. An electromagnetic interference shielding assembly, comprising:
    (a) an elongated enclosure made of an electrically conductive material and having a plurality of interconnected walls arranged in a polygonal configuration to surround an electronic component on a circuit board, each of said walls having a lower portion and an upper portion extending upwardly from said lower portion;
    (b) a plurality of mounting pins attached to said lower portions of said respective walls and extending downwardly from lower edges thereon for attachment to the circuit board;
    (c) a plurality of inner and outer tabs formed in said upper portions of said respective walls, said inner and outer tabs being disposed in spaced, alternating and offset relationship with respect to one another along said upper portions of said walls so as to create an annular channel between said inner and outer tabs extending along said upper portions of said respective interconnected walls of said enclosure, said annular channel being open from above; and
    (d) a cover made of electrically conductive material and having a top portion and a plurality of side portions attached to and extending downwardly from said top portion and arranged in a polygonal configuration matching that of said interconnected walls of said enclosure, said side portions of said cover being removably inserted downwardly into said annular channel defined by said inner and outer tabs and into a frictional fitting relation therewith to thereby removably mount said cover over said enclosure and provide an electromagnetic interference shield for the electronic component.

11. The assembly of claim 10 wherein:
    each of said walls of said enclosure is planar in configuration; and
    each of said mounting pins is integrally formed with and extend in the plane of a respective one of said walls.

12. The assembly of claim 10 wherein:
    each of said walls of said enclosure is planar in configuration; and
    said outer tabs in said upper portion of a respective one of said walls are integrally connected to said lower portion of said respective one wall so as to extend substantially in the plane of said lower portion of said wall.

13. The assembly of claim 12 wherein said outer tabs have upper ends which are flared outwardly beyond the plane of said wall.

14. The assembly of claim 10 wherein said inner tabs in said upper portion of a respective one of said walls are integrally connected to said lower portion of said wall and extending in an offset fashion inwardly and upwardly therefrom.

15. An electromagnetic interference shielding assembly, comprising:
   (a) an elongated enclosure made of an electrically conductive material and having a plurality of interconnected walls arranged in a polygonal configuration to surround an electronic component on a circuit board, each of said walls having a lower portion and an upper portion extending upwardly from said lower portion;
   (b) a plurality of mounting pins attached to said lower portions of said respective walls and extending downwardly from lower edges thereon for attachment to the circuit board;
   (c) a plurality of inner and outer tabs formed in said upper portions of said respective walls, said inner and outer tabs being disposed in spaced, alternating and offset relationship with respect to one another along said upper portions of said walls so as to create an annular channel between said inner and outer tabs extending along said upper portions of said respective interconnected walls of said enclosure, said inner tabs in said upper portion of a respective one of said walls being integrally connected to said lower portion of said wall and extending in an offset fashion inwardly and upwardly therefrom; and
   (d) a cover made of electrically conductive material and having a top portion and a plurality of side portions attached to and extending downwardly from said top portion and arranged in a polygonal configuration matching that of said interconnected walls of said enclosure, said side portions of said cover being removably inserted into said annular channel defined by said inner and outer tabs and into a frictional fitting relation therewith to thereby removably mount said cover over said enclosure and provide an electromagnetic interference shield for the electronic component.

16. The assembly of claim 15 wherein said inner tabs have bends at least at two spaced parallel locations thereon so as to align said inner tabs in the offset relationship to said wall.

17. The assembly of claim 15 wherein said inner tabs have lower inwardly extending portions which define positive downward stops which prevent overinsertion of said cover into said annular channel of said enclosure.

18. The assembly of claim 15 wherein at least a selected one of said inner tabs has a hole defined therethrough.

19. The assembly of claim 18 wherein a selected one of said side portions of said cover contains at least one dimple which interengages with said hole of said selected one of said inner tab.

20. The assembly of claim 10 wherein said inner tabs have means for defining positive downward stops which prevent overinsertion of said cover into said annular channel of said enclosure.

21. The enclosure of claim 6 wherein said inner tabs have upper ends which are flared inwardly.

22. The assembly of claim 15 wherein said inner tabs have upper ends which are flared inwardly.

* * * * *